US009530696B1

(12) United States Patent
Liu et al.

(10) Patent No.: US 9,530,696 B1
(45) Date of Patent: Dec. 27, 2016

(54) METHOD OF FABRICATING SEMICONDUCTOR DEVICE

(71) Applicant: United Microelectronics Corp., Hsinchu (TW)

(72) Inventors: Wei-Hsin Liu, Changhua County (TW); Fu-Yu Tsai, Tainan (TW); Bin-Siang Tsai, Changhua County (TW); Wei-Lun Hsu, Taichung (TW); Shang-Yi Yang, Taichung (TW); Pi-Hsuan Lai, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/921,514

(22) Filed: Oct. 23, 2015

(51) Int. Cl.
*H01L 21/02* (2006.01)
*H01L 29/66* (2006.01)
*H01L 29/78* (2006.01)
*H01L 21/8234* (2006.01)
*H01L 21/321* (2006.01)
*H01L 21/311* (2006.01)
*H01L 21/3105* (2006.01)

(52) U.S. Cl.
CPC ... *H01L 21/823431* (2013.01); *H01L 21/0217* (2013.01); *H01L 21/02126* (2013.01); *H01L 21/02167* (2013.01); *H01L 21/02172* (2013.01); *H01L 21/02521* (2013.01); *H01L 21/02532* (2013.01); *H01L 21/31055* (2013.01); *H01L 21/31144* (2013.01); *H01L 21/3212* (2013.01); *H01L 21/823418* (2013.01); *H01L 21/823437* (2013.01); *H01L 29/6656* (2013.01); *H01L 29/66545* (2013.01); *H01L 29/66636* (2013.01); *H01L 29/7848* (2013.01)

(58) Field of Classification Search
CPC ............ H01L 21/02293; H01L 21/28079; H01L 21/31144; H01L 21/31055; H01L 21/31051; H01L 21/02532; H01L 21/823418; H01L 29/6656; H01L 29/66545; H01L 29/66636; H01L 29/7848

See application file for complete search history.

(56) References Cited

U.S. PATENT DOCUMENTS

| 8,883,623 | B2 | 11/2014 | Xie et al. | |
|---|---|---|---|---|
| 2001/0049183 | A1* | 12/2001 | Henson | H01L 21/28114 438/479 |
| 2013/0161746 | A1* | 6/2013 | Posseme | H01L 29/78696 257/347 |
| 2013/0228871 | A1 | 9/2013 | Huang et al. | |
| 2014/0346608 | A1* | 11/2014 | Kim | H01L 21/28518 257/369 |
| 2015/0206949 | A1* | 7/2015 | Zhao | H01L 29/495 257/410 |
| 2015/0380558 | A1* | 12/2015 | Huang | H01L 29/7851 257/288 |

* cited by examiner

*Primary Examiner* — Caridad Everhart
(74) *Attorney, Agent, or Firm* — J.C. Patents

(57) ABSTRACT

A method of fabricating a semiconductor device is provided. A plurality of sacrificial gates and a plurality of sacrificial gate dielectric layers thereunder are formed on a substrate. An interlayer dielectric layer is filled between the sacrificial gates. A protective layer is formed on the interlayer dielectric layer. The sacrificial gates and the sacrificial gate dielectric layers are removed to form an opening, wherein the interlayer dielectric layer is protected by the protective layer from recessing. A stacked gate structure is formed in the opening, wherein the protective layer is removed.

11 Claims, 5 Drawing Sheets

METHOD OF FABRICATING SEMICONDUCTOR DEVICE

BACKGROUND OF THE INVENTION

Field of the Invention

The invention relates to a method for fabricating a semiconductor device, and particularly relates to a method for fabricating a field effect transistor (FET) semiconductor device.

Description of Related Art

A semiconductor device typically includes a core device area and an I/O device area. The core device area may be a FinFET area while the semiconductor device is a FinFET semiconductor device, for example. In a process of fabricating the semiconductor device, a sacrificial gate dielectric layer of the core device and a gate dielectric layer of the I/O device area may be formed at the same time. Since the demand of the gate dielectric layer of the core device and the demand of the gate dielectric layer of the I/O device are different, the sacrificial gate dielectric layer in the core area is removed before forming a desired gate dielectric layer in the core area. For example, the gate dielectric layer in the core area is thinner than the gate dielectric layer in the I/O device area.

However, the removal process for removing the sacrificial gate dielectric layer under the sacrificial gate may cause the loss of the interlayer dielectric layer between the sacrificial gates. That is, a height of the interlayer dielectric layer is decrease. As such, to lower the gate formed in the following steps is needed or a short circuit may happen. Otherwise, the lower gate may cause increasing a resistance of the gate. Therefore, how to prevent the loss of the interlayer dielectric layer in the removal process is certainly an issue to be worked on.

SUMMARY OF THE INVENTION

A method of fabricating semiconductor device is provided. The loss of the interlayer dielectric layer may be avoided. Thus, the height of the gate formed in the following steps may be maintained to prevent increasing the resistance of the gate.

The invention provides a method for fabricating a semiconductor device including steps as follows. A plurality of sacrificial gates and a plurality of sacrificial gate dielectric layers thereunder are formed on a substrate. An interlayer dielectric layer is filled between the sacrificial gates. A protective layer is formed on the interlayer dielectric layer. The sacrificial gates and the sacrificial gate dielectric layers are removed to form an opening, wherein the interlayer dielectric layer is protected by the protective layer from recessing. A stacked gate structure is formed in the opening, wherein the protective layer is removed.

According to an embodiment of the invention, a method of forming the protective layer includes a combination of a deposition process, a lithography process, and an etching process.

According to an embodiment of the invention, the stacked gate structure includes a gate dielectric layer and a metal gate layer, wherein the metal gate layer is disposed on the gate dielectric layer.

According to an embodiment of the invention, a method of forming the stacked gate structure and removing the protective layer includes the following steps. A gate dielectric material layer and a metal gate material layer are formed sequentially. A chemical mechanical polishing process is performed to remove the gate dielectric material layer and the metal gate material layer outside the opening and to remove the protective layer.

According to an embodiment of the invention, the metal gate layer includes a work function metal layer and a low resistance metal layer formed sequentially.

According to an embodiment of the invention, after forming the sacrificial gates and before filling the interlayer dielectric layer further including the following steps. Spacers are formed on sidewalls of the sacrificial gates. Parts of the substrate between the spacers are removed. An epitaxial layer grows from the substrate between the spacers. The epitaxial layer has different lattice constant from the substrate.

According to an embodiment of the invention, a material of the epitaxial layer includes SiGe or SiP.

According to an embodiment of the invention, after forming the epitaxial layer further including forming a contact etch stop layer on the spacers and the epitaxial layer.

According to an embodiment of the invention, a material of the protective layer includes metal oxide, metal nitride, SiN, SiCN, SiC or SiON.

According to an embodiment of the invention, the sacrificial gate dielectric layer includes a first silicon oxide, and the interlayer dielectric layer includes a second silicon oxide.

According to an embodiment of the invention, before forming the plurality of sacrificial gates and the plurality of sacrificial gate dielectric layers, further including patterning the substrate to form a plurality of fins, wherein the plurality of sacrificial gate dielectric layers are disposed on the plurality of fins.

According to an embodiment of the invention, the sacrificial gate dielectric layer and a gate dielectric layer of an I/O device area are formed at the same time, and the sacrificial gate and a gate of the I/O device area are formed at the same time.

In view of the above, according to the method of fabricating the semiconductor device provided herein, the loss of the interlayer dielectric layer may be avoided since the protective layer is formed on the interlayer dielectric layer before removing the sacrificial gates and the sacrificial gate dielectric layer thereunder. As such, the height of the gate may be maintained. Otherwise, the increases in the resistance of the gates resulted from the reduction of the height of the gate will not happen.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is noted that the following embodiments are intended to further explain this invention but not to limit the scope thereof. Otherwise, the semiconductor device may include a core device area and an I/O device area of the invention, wherein the core device area may be a FinFET area or a normal flat substrate area.

FIG. 1A to FIG. 1I are schematic cross-sectional views illustrating a method of fabricating a semiconductor device in the y-axis direction according to an embodiment of the invention. FIG. 2 is a schematic cross-sectional view illustrating a sacrificial gate of a semiconductor device of FIG. 1A in the x-axis direction.

Figure 1A:
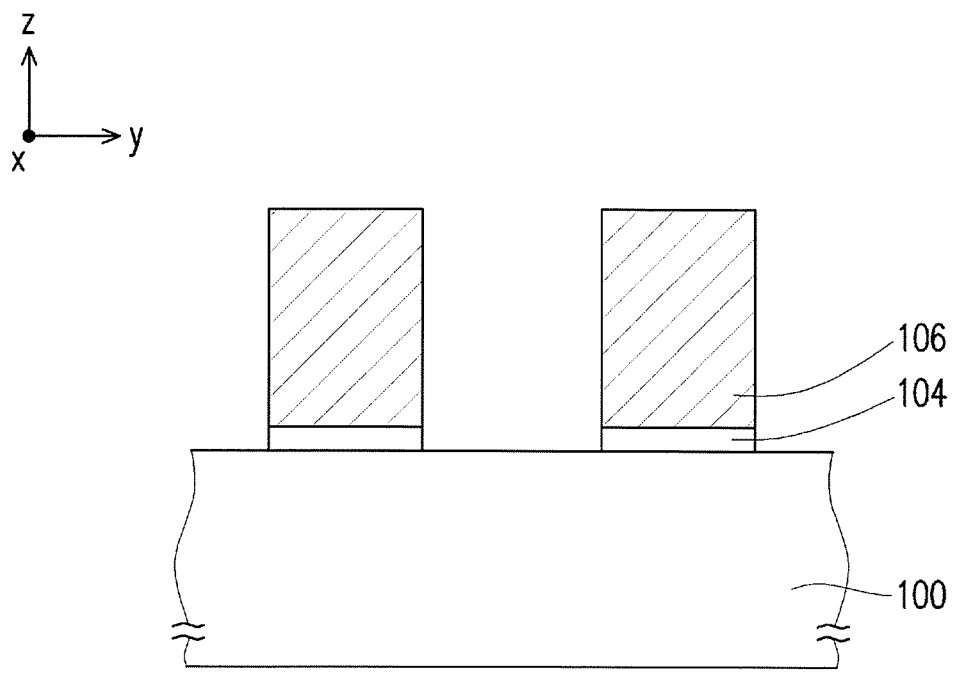
FIG. 1A to FIG. 1I are schematic cross-sectional views illustrating a method of fabricating a semiconductor device in the y-axis direction according to an embodiment of the invention.
Figure 2:
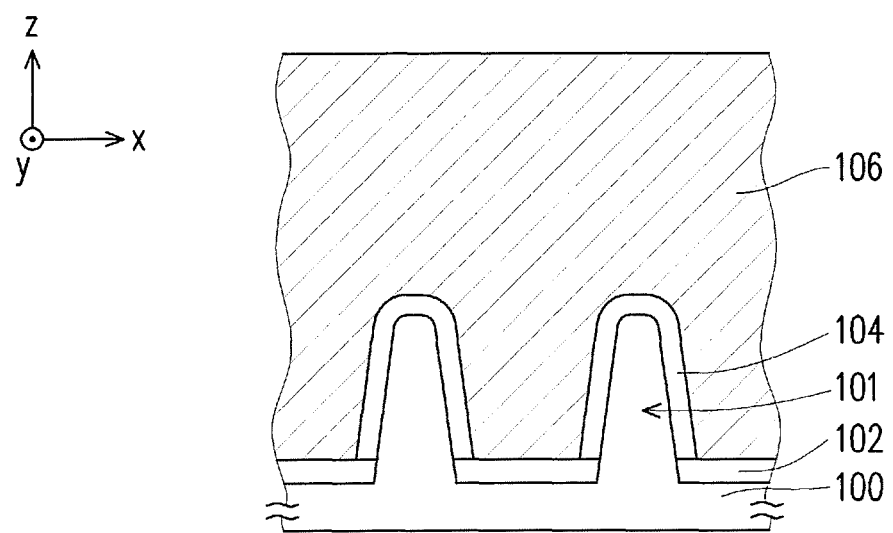
FIG. 2 is a schematic cross-sectional view illustrating a sacrificial gate of a semiconductor device of FIG. 1A in the x-axis direction.

Referring to FIG. 1A, a substrate 100 is provided. The substrate 100 may be a semiconductor substrate. The semiconductor substrate is formed of silicon or a semiconductor compound (e.g., gallium arsenide), for example.

Then, a plurality of sacrificial gates 106 and a plurality of sacrificial gate dielectric layers 104 thereunder are formed on the substrate 100. A material of the sacrificial gate dielectric layer 104 may include silicon oxide, for example. A thickness of the sacrificial gate dielectric layer 104 may range from 10 angstroms to 100 angstroms, for example. In some embodiments, the thickness of the sacrificial gate dielectric layer 104 may be 35 angstroms, for example. However, the invention is not limited thereto. A material of the sacrificial gates 106 may include doped polysilicon, for example. In some embodiments, in a method of forming the sacrificial gates 106 and the sacrificial gate dielectric layers 104, for example, a sacrificial gate dielectric material layer (not shown) and a sacrificial gate material layer (not shown) are sequentially formed on the substrate 100. Then, the sacrificial gate material layer and the sacrificial gate dielectric material layer are patterned to form the plurality of sacrificial gates 106 and the plurality of sacrificial gate dielectric layers 104 thereunder on the substrate 100. A method of forming the sacrificial gate dielectric material layer may include a thermal oxidation proves or a CVD process, for example. A method of forming the sacrificial gate material layer may include a CVD process, for example.

In some embodiments, the substrate 100 is patterned to form a plurality of fins 101 extending along the y-axis direction, and an insulating material is filled in between the fins 101 to form the isolation layers 102 as shown in FIG. 2. In this case, the plurality of sacrificial gate dielectric layers 104 are formed on surfaces of the fins 101 of the substrate 100 outside the isolation layer 102. Then, the plurality of sacrificial gates 106 are formed on the plurality of sacrificial gate dielectric layers 104 and extending along the x-axis direction to cross over the fins 101 of the substrate 100. In this embodiment, the core area of the semiconductor device is a FinFET area. However, the invention is not limited thereto.

In some embodiment, the sacrificial gate dielectric layer 104 is formed in the core area of the semiconductor device while a gate dielectric layer (not shown) is formed in the I/O device area of the semiconductor device. In the same way, the sacrificial gate 106 is formed in the core area of the semiconductor device while a gate (not shown) is formed in the I/O device area of the semiconductor device. However, the invention is not limited thereto.

Figure 1B:
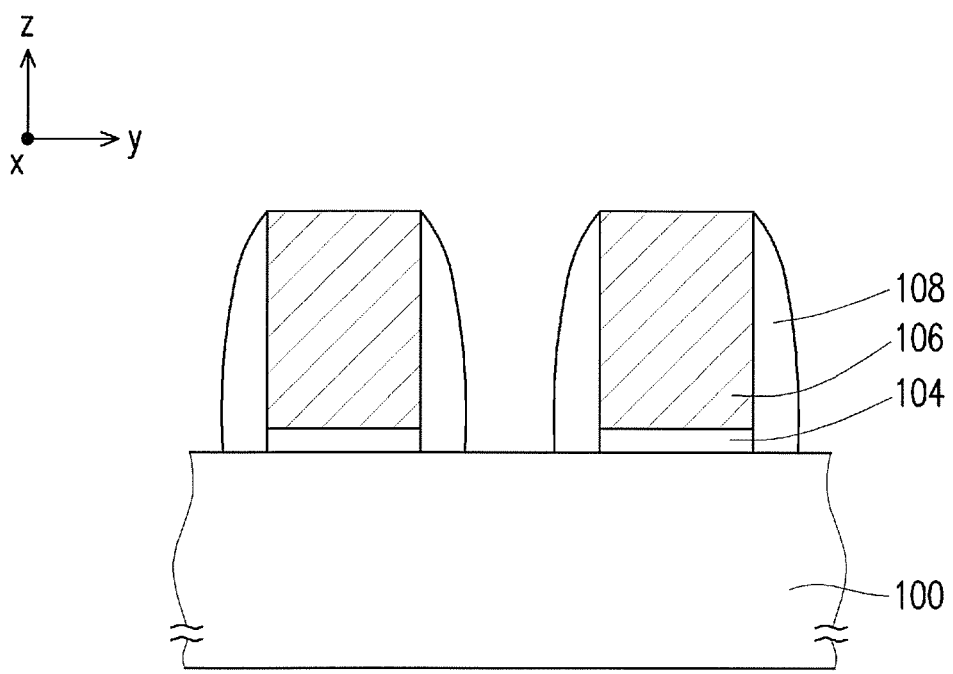

Referring to FIG. 1B, spacers 108 can be formed on sidewalls of the sacrificial gates 106. In some embodiments, in a method of forming the spacers 108, for example, a spacer material layer (not shown) covering the sacrificial gate 106 is formed on the sacrificial gate 106 and the substrate 100, and an etching back process is performed on the spacer material layer, such as a dry etching process, so as to form the spacers 108. A material of the spacers 108 may include silicon carbonitride (SiCN), silicon oxycarbonitride (SiOCN), silicon oxynitride (SiON), or silicon nitride (SiN), for example.

Figure 1C:
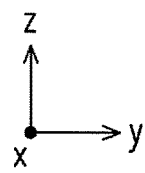
Figure 1C:
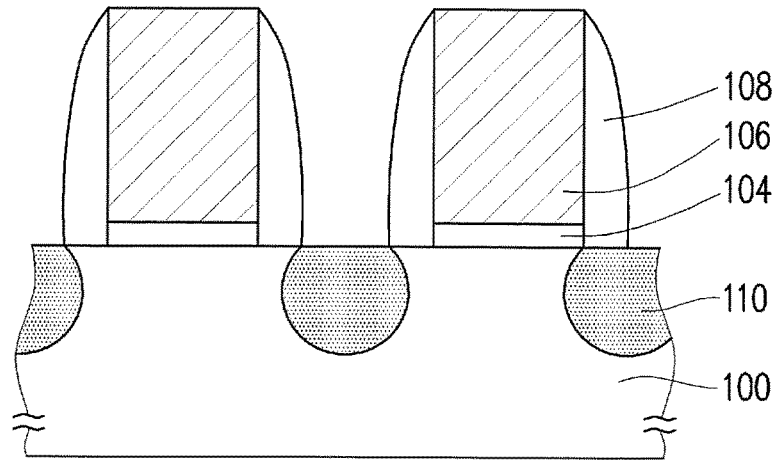

Referring to FIG. 1C, parts of the substrate 100 between the spacers 108 can be removed, and an epitaxial layer 110 is formed from the substrate 100 between the spacers 108. The epitaxial layer 110 has different lattice constant from the substrate 100. In some embodiments, a material of the epitaxial layer 110 may include silicon germanium (SiGe) or silicon phosphorous (SiP), for example. In some embodiments, the epitaxial layer 110 may include SiGe when the core area is a PMOS core area, and the epitaxial layer 110 may cause a compress stress to the channel region. In some embodiments, the epitaxial layer 110 may include SiP when the core area is a NMOS core area, and the epitaxial layer 110 may cause a tensile stress to the channel region. However, the invention is not limited thereto.

Figure 1D:
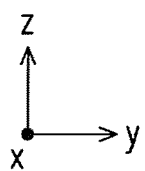
Figure 1D:
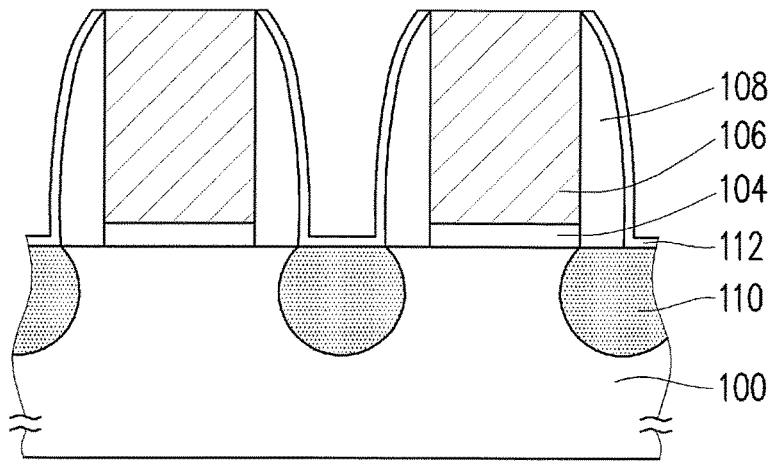

Referring to FIG. 1D, a contact etch stop layer 112 can be formed on the spacers 108 and the epitaxial layer 110. In some embodiments, in a method of forming the contact etch stop layer 112, for example, a contact etch stop material layer (not shown) covering the sacrificial gate 106 is formed on the spacers 108 and the epitaxial layer 110, and an etching process is performed to remove the contact etch stop material layer on a top surface of the sacrificial gate 106 to form the contact etch stop layer 112. A material of the contact etch stop material layer may include SiN, for example. A method of forming the contact etch stop material layer may be a CVD process, for example.

Figure 1E:
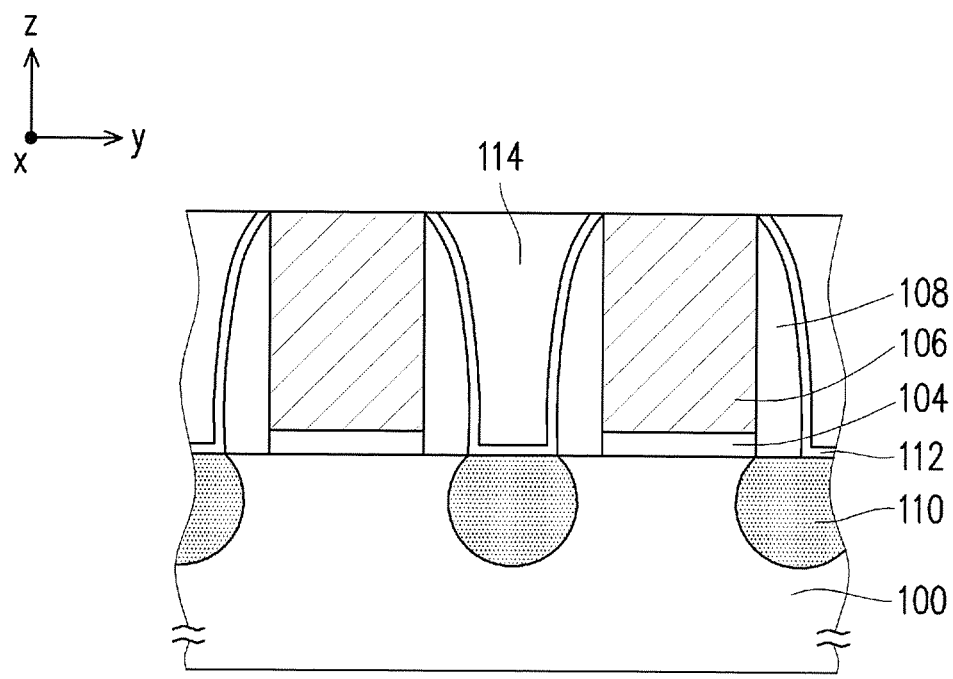

Referring to FIG. 1E, an interlayer dielectric layer 114 is filled between the sacrificial gates 106. A material of the interlayer dielectric layer 114 may include silicon oxide, for example. A method of forming the interlayer dielectric layer 114 may include a CVD process, for example. In some embodiments, the material of the sacrificial gate dielectric layer 104 and the material of the interlayer dielectric layer 114 are the same. For example, the sacrificial gate dielectric layer 104 includes a first silicon oxide, and the interlayer dielectric layer 114 includes a second silicon oxide. However, the invention is not limited thereto. In some embodiments, the material of the sacrificial gate dielectric layer 104 and the material of the interlayer dielectric layer 114 are different. The etching selectivity ratio between the material of the sacrificial gate dielectric layer 104 and the material of the interlayer dielectric layer 114 is poor, for example.

Figure 1F:
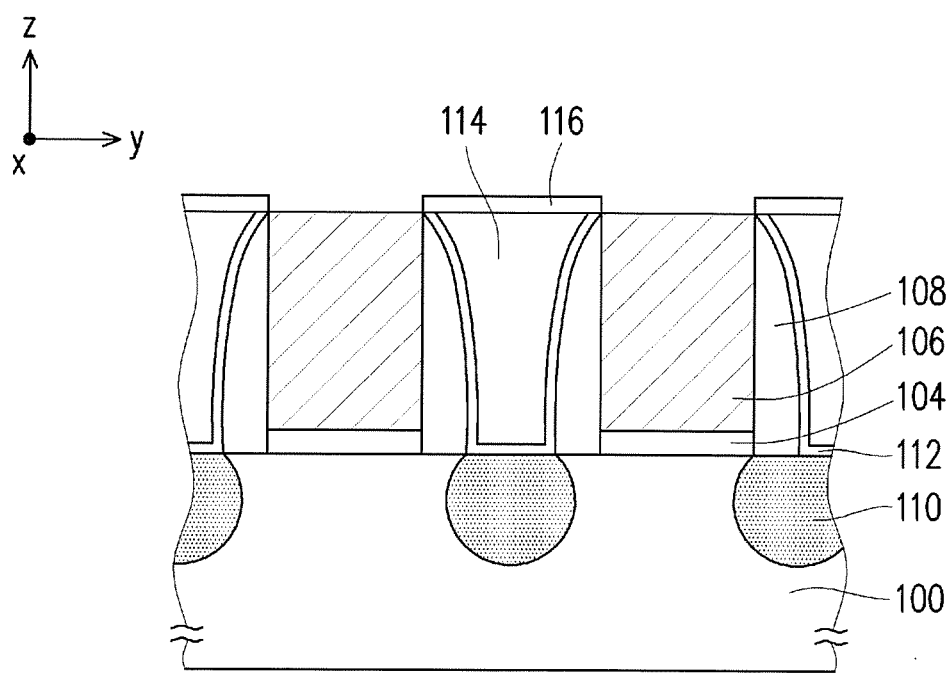

Referring to FIG. 1F, a protective layer 116 is formed on the interlayer dielectric layer 114. A material of the protective layer 116 may include metal oxide, metal nitride, SiN, SiCN, SiC, SiON, or a combination thereof, for example. Any material may be selected as the protective layer 116, as long as it has a desired etching selectivity ratio with the interlayer dielectric layer 114. A thickness of the protective layer 116 may range from 20 angstroms to 500 angstroms, for example. A method of forming the protective layer 116 includes a combination of a deposition process, a lithography process, and an etching process. In some embodiments, in a method of forming the protective layer 116, for example, a protective material layer (not shown) is deposited covering surfaces of the interlayer dielectric layer 114 and the sacrificial gates 106 first. After that, the lithography process is performed to define the protective material layer. Then, the etching process is performed to remove the protective material layer on the sacrificial gates 106, so as to form the protective layer 116 on the interlayer dielectric layer 114. The protective layer 116 may protect the interlayer dielectric layer 114 from recessing in the following process.

Figure 1G:
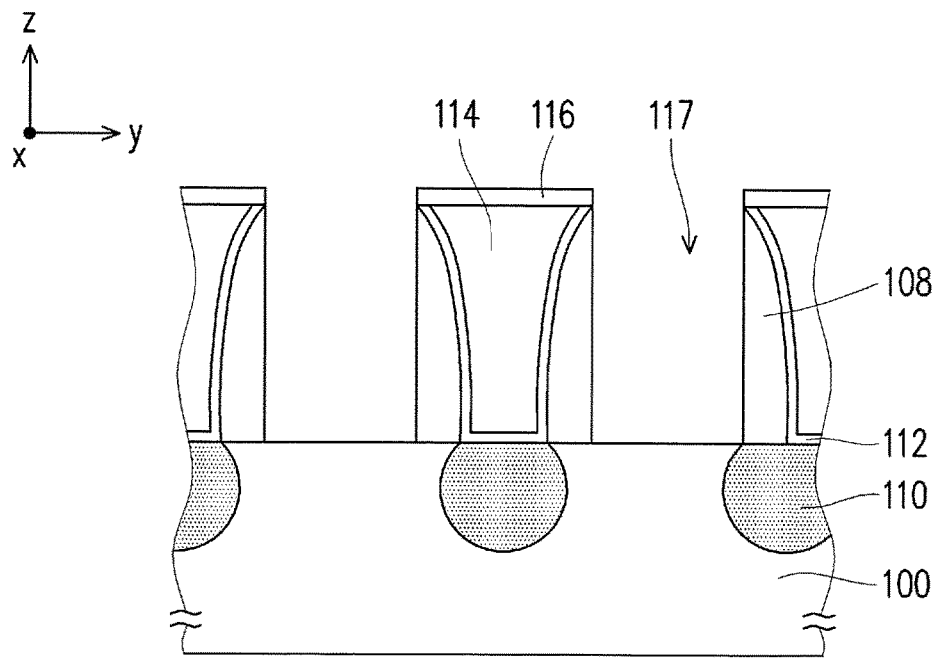

Referring to FIG. 1G, the sacrificial gates 106 and the sacrificial gate dielectric layers 104 thereunder are removed to form an opening 117. A method of removing the sacrificial gates 106 and the sacrificial gate dielectric layers 104 may be a dry etching process or a wet etching process, for example. It is noted that the interlayer dielectric layer 114 may not be removed by etching since the protective layer 116 may be acted as a hard mask to protect the interlayer dielectric layer 114. As such, a height of the interlayer dielectric layer 114 may be maintained and a height of a stacked gate structure formed in the following steps will not be influenced.

Figure 1H:
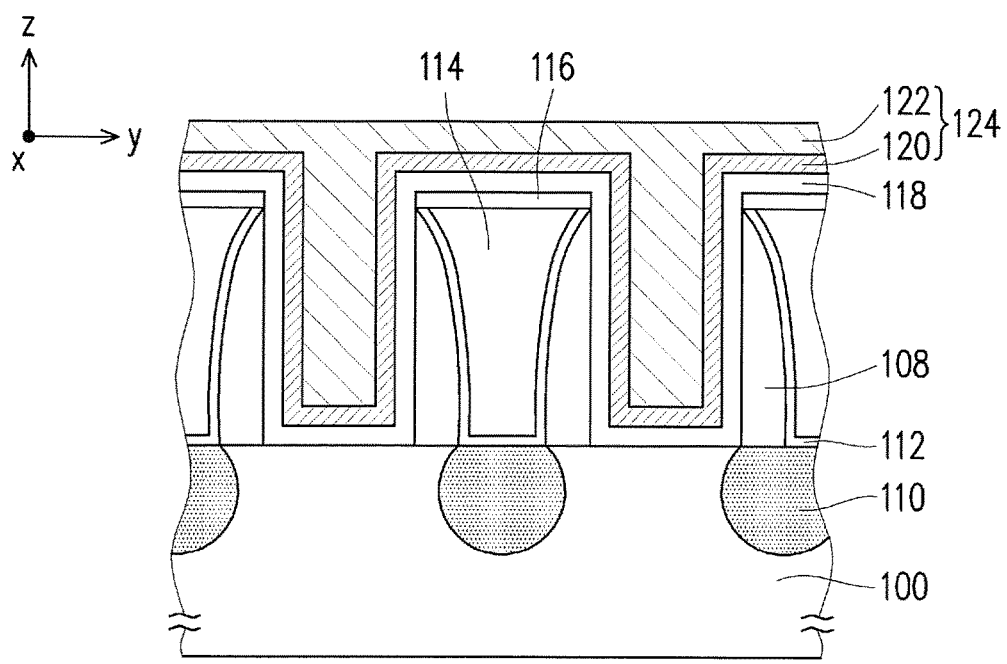

Referring to FIG. 1H, a gate dielectric material layer 118 and a metal gate material layer 124 are formed sequentially in the opening 117 and over the protective layer 116. In some embodiments, the gate dielectric material layer 118 and the metal gate material layer 124 are formed conformally along sidewalls and a bottom surface of the opening 117 and a top surface of the protective layer 116. A material of the gate dielectric material layer 118 may include $HfO_2$, $ZrO_2$, $Al_2O_3$, $TiO_2$, $La_2O_3$, $Y_2O_3$, a common high-κ material, and silicon oxide, SiON, etc., for example. A method of forming the gate dielectric material layer 118 may include a CVD process, for example. In some embodiments, the metal gate material layer 124 may include a work function metal material layer 120 and a low resistance metal material layer 122. A material of the work function metal material layer 120 may include titanium nitride (TiN), titanium aluminide (TiAl), tantalum aluminide (TaAl), or a combination thereof, for example. A material of the low resistance metal material layer 122 may include W, Cu, Al, or other materials with low resistance, for example. In some embodiments, the work function metal material layer 120 and the low resistance metal material layer 122 may be formed sequentially. A method of forming the work function metal material layer 120 may include an ALD process, for example. A method of forming the low resistance metal material layer 122 may include a PVD process, for example.

Figure 1I:
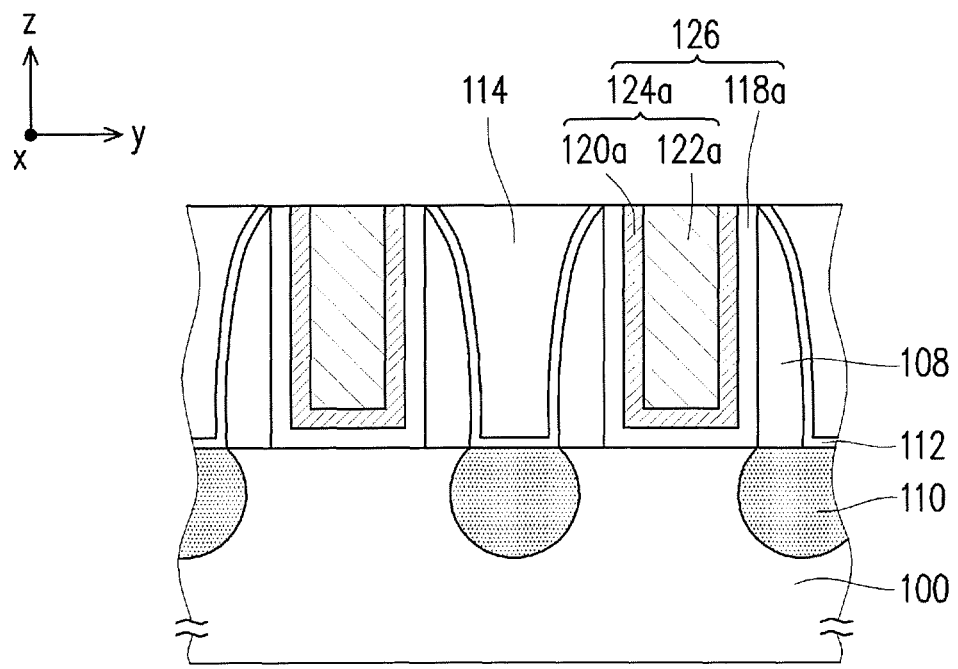

Referring to FIG. 1I, a chemical mechanical polishing (CMP) process is performed to remove the gate dielectric material layer 118 and the metal gate material layer 124 outside the opening 117, so as to form a gate dielectric layer 118a and a metal gate layer 124a, wherein the metal gate layer 124a is disposed on the gate dielectric layer 118a. The metal gate layer 124a includes a work function metal layer 120a and a low resistance metal layer 122a. Therefore, a stacked gate structure 126 is formed in the opening 117. The stacked gate structure 126 includes the gate dielectric layer 118a and the metal gate layer 124a, and the metal gate layer 124a is disposed on the gate dielectric layer 118a. In some embodiments, the chemical mechanical polishing (CMP) process may be a tungsten chemical mechanical polishing (WCMP) process, for example. It should be noted that the protective layer 116 is removed at the same time to avoid replacing etching recipe in the following process of forming contact openings. In some embodiments, the protective layer 116 is removed by an over-polishing process, for example. In some embodiments, the protective layer 116 is removed by replacing the polishing pad to the specific polishing pad for the material of the protective layer (e.g., SiN) in the CMP process. However, the invention is not limited thereto.

To sum up, the method of fabricating the semiconductor device provided in the embodiments above has at least the following advantages. The loss of the interlayer dielectric layer may be avoided since the protective layer is formed on the interlayer dielectric layer before removing the sacrificial gates and the sacrificial gate dielectric layer thereunder. As such, the height of the gate may be maintained. Otherwise, the increases in the resistance of the gates resulted from the reduction of the height of the gate will not happen.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of fabricating a semiconductor device, comprising:
    forming a plurality of sacrificial gates and a plurality of sacrificial gate dielectric layers thereunder on a substrate;
    before forming the plurality of sacrificial gates and the plurality of sacrificial gate dielectric layers, patterning the substrate to form a plurality of fins, wherein the plurality sacrificial gate dielectric layers are disposed on the plurality of fins;
    filling an interlayer dielectric layer between the sacrificial gates;
    forming a protective layer on the interlayer dielectric layer;
    removing the sacrificial gates and the sacrificial gate dielectric layers to form an opening, wherein the interlayer dielectric layer is protected by the protective layer from recessing; and
    forming a stacked gate structure in the opening, wherein the protective layer is removed.

2. The method of fabricating the semiconductor device according to claim 1, wherein a method of forming the protective layer comprises a combination of a deposition process, a lithography process, and an etching process.

3. The method of fabricating the semiconductor device according to claim 1, wherein a material of the protective layer comprises metal oxide, metal nitride, SiN, SiCN, SiC or SiON.

4. The method of fabricating the semiconductor device according to claim 1, wherein the sacrificial gate dielectric layer comprises a first silicon oxide, and the interlayer dielectric layer comprises a second silicon oxide.

5. The method of fabricating the semiconductor device according to claim 1, wherein forming the sacrificial gate dielectric layer and forming a gate dielectric layer of an I/O device area are at the same time, and forming the sacrificial gate and forming a gate of the I/O device area are at the same time.

6. The method of fabricating the semiconductor device according to claim 1, wherein the stacked gate structure comprises a gate dielectric layer and a metal gate layer, and the metal gate layer is disposed on the gate dielectric layer.

7. The method of fabricating the semiconductor device according to claim 6, wherein a method of forming the stacked gate structure and removing the protective layer comprising:
    forming a gate dielectric material layer and a metal gate material layer sequentially; and
    performing a chemical mechanical polishing process to remove the gate dielectric material layer and the metal gate material layer outside the opening and to remove the protective layer.

8. The method of fabricating the semiconductor device according to claim 6, wherein the metal gate layer comprises a work function metal layer and a low resistance metal layer formed sequentially.

9. The method of fabricating the semiconductor device according to claim 1, after forming the sacrificial gates and before filling the interlayer dielectric layer, further comprising:
   forming spacers on sidewalls of the sacrificial gates;
   removing parts of the substrate between the spacers, and
   growing an epitaxial layer from the substrate between the spacers, wherein the epitaxial layer has different lattice constant from the substrate.

10. The method of fabricating the semiconductor device according to claim 9, wherein a material of the epitaxial layer comprises SiGe or SiP.

11. The method of fabricating the semiconductor device according to claim 9, after forming the epitaxial layer, further comprising forming a contact etch stop layer on the spacers and the epitaxial layer.

* * * * *